United States Patent
Lu et al.

(10) Patent No.: US 10,590,556 B2
(45) Date of Patent: Mar. 17, 2020

(54) COPPER ELECTROPLATING BATHS CONTAINING COMPOUNDS OF REACTION PRODUCTS OF AMINES AND QUINONES

(71) Applicants: Dow Global Technologies LLC, Midland, MI (US); Rohm and Haas Electronic Materials LLC, Marlborough, MA (US)

(72) Inventors: Weijing Lu, Fanling (HK); Lingli Duan, Pudong District (CN); Zukhra Niazimbetova, Marlborough, MA (US); Chen Chen, Pudong District (CN); Maria Rzeznik, Marlborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 83 days.

(21) Appl. No.: 15/752,625

(22) PCT Filed: Oct. 8, 2015

(86) PCT No.: PCT/CN2015/091432
§ 371 (c)(1),
(2) Date: Feb. 14, 2018

(87) PCT Pub. No.: WO2017/059563
PCT Pub. Date: Apr. 13, 2017

(65) Prior Publication Data
US 2018/0237930 A1    Aug. 23, 2018

(51) Int. Cl.
| | | |
|---|---|---|
| C25D 3/38 | (2006.01) |
| C25D 3/58 | (2006.01) |
| C08G 73/02 | (2006.01) |
| C25D 3/56 | (2006.01) |
| C23C 18/16 | (2006.01) |
| C25D 7/12 | (2006.01) |
| H01L 21/288 | (2006.01) |
| H01L 21/768 | (2006.01) |
| H05K 3/42 | (2006.01) |

(52) U.S. Cl.
CPC ............. *C25D 3/38* (2013.01); *C08G 73/024* (2013.01); *C25D 3/56* (2013.01); *C25D 3/58* (2013.01); *C23C 18/1653* (2013.01); *C25D 7/123* (2013.01); *H01L 21/2885* (2013.01); *H01L 21/76879* (2013.01); *H05K 3/424* (2013.01); *H05K 2203/0723* (2013.01)

(58) Field of Classification Search
None
See application file for complete search history.

(56) References Cited

U.S. PATENT DOCUMENTS 5,284,683 A    2/1994 Semih

FOREIGN PATENT DOCUMENTS

| CN | 104762643 | * 12/2014 | ............... C25D 3/38 |
| JP | 4941500 A | 4/1974 | |

OTHER PUBLICATIONS

CN104762643, 2014, Wang Jing, Derwent Abstract.*
Search report for corresponding Europe Application No. 15 90 5661 dated Mar. 6, 2019.
Machocho, et al, "Reaction of benzoquinones and naphthoquinones with 1,8-diamino-3,6-dioxanonane and with 1,11-diamino-3,6,9-trioxaundecane", Tetrahedron Letters, Jul. 14, 2003, pp. 5531-5534, vol. 44, No. 29.
Nithianandam, et al, "Quinone-amine polymers. V. Syntheses and solubilities of several diamine-p-benzoquinone oligomers (PAQ)", Journal of Applied Polymer Science, Jun. 5, 1991, pp. 2893-2897, vol. 42, No. 11.
Search report for corresponding Europe Application No. 15 90 5661 dated Apr. 8, 2019.
Search report for corresponding China Application No. 201580083216.1 dated Oct. 25, 2019.

* cited by examiner

*Primary Examiner* — Clinton A Brooks
(74) *Attorney, Agent, or Firm* — John J. Piskorski

(57) ABSTRACT

A polymer composed of a reaction product of an amine and a quinone. The quinone is a Michael addition receptor. The polymer may be an additive for a copper electroplating bath. The polymer may function as a leveler and enable the copper electroplating bath to have high throwing power and provide copper deposits with reduced nodules.

9 Claims, No Drawings

COPPER ELECTROPLATING BATHS CONTAINING COMPOUNDS OF REACTION PRODUCTS OF AMINES AND QUINONES

FIELD OF THE INVENTION

The present invention is directed copper electroplating baths containing compounds of reaction products of amines and quinones as Michael addition receptors. More specifically, the present invention is directed to copper electroplating baths containing compounds of reaction products of amines and quinones as Michael addition receptors which have high throwing power and copper deposits with reduced nodules.

BACKGROUND OF THE INVENTION

Methods for electroplating articles with metal coatings generally involve passing a current between two electrodes in a plating solution where one of the electrodes is the article to be plated. A typical acid copper electroplating solution includes dissolved copper, usually copper sulfate, an acid electrolyte such as sulfuric acid in an amount sufficient to impart conductivity to the bath, a source of halide, and proprietary additives to improve the uniformity of the plating and the quality of the metal deposit. Such additives include levelers, accelerators and suppressors, among others.

Electrolytic copper plating solutions are used in a variety of industrial applications, such as decorative and anticorrosion coatings, as well as in the electronics industry, particularly for the fabrication of printed circuit boards and semiconductors. For circuit board fabrication, typically, copper is electroplated over selected portions of the surface of a printed circuit board, into blind vias and trenches and on the walls of through-holes passing between the surfaces of the circuit board base material. The exposed surfaces of blind vias, trenches and through-holes, i.e., the walls and the floor, are first made conductive, such as by electroless metallization, before copper is electroplated on surfaces of these apertures. Plated through-holes provide a conductive pathway from one board surface to the other. Vias and trenches provide conductive pathways between circuit board inner layers. For semiconductor fabrication, copper is electroplated over a surface of a wafer containing a variety of features such as vias, trenches or combinations thereof. The vias and trenches are metallized to provide conductivity between various layers of the semiconductor device.

It is well known in certain areas of plating, such as in electroplating of printed circuit boards ("PCBs"), that the use of levelers in the electroplating bath can be crucial in achieving a uniform metal deposit on a substrate surface. Electroplating a substrate having irregular topography can pose difficulties. During electroplating a voltage drop typically occurs within apertures in a surface, which can result in an uneven metal deposit between the surface and the apertures. Electroplating irregularities are exacerbated where the voltage drop is relatively extreme, that is, where the apertures are narrow and tall. Consequently, depositing a metal layer of substantially uniform thickness is frequently a challenging step in the manufacture of electronic devices. Leveling agents are often used in copper plating baths to provide substantially uniform, or level, copper layers in electronic devices.

The trend of portability combined with increased functionality of electronic devices has driven the miniaturization of PCBs. Conventional multilayer PCBs with through-hole interconnects are not always a practical solution. Alternative approaches for high density interconnects have been developed, such as sequential build up technologies, which utilize blind vias. One of the objectives in processes that use blind vias is the maximizing of via filling while minimizing thickness variation in the copper deposit between the vias and the substrate surface. This is particularly challenging when the PCB contains both through-holes and blind vias.

Leveling agents are used in copper plating baths to level the deposit across the substrate surface and to improve the throwing power of the electroplating bath. Throwing power is defined as the ratio of the through-hole center copper deposit thickness to its thickness at the surface. Newer PCBs are being manufactured that contain both through-holes and blind vias. Current bath additives, in particular current leveling agents, do not always provide level copper deposits between the substrate surface and filled through-holes and blind vias. Via fill is characterized by the difference in height between the copper in the filled via and the surface. Accordingly, there remains a need in the art for leveling agents for use in metal electroplating baths for the manufacture of PCBs that provide level copper deposits while bolstering the throwing power of the bath.

SUMMARY OF THE INVENTION

A compound including a reaction product of an amine and a quinone where the amine has a formula:

where R' is selected from hydrogen or a moiety: —$CH_2$—$CH_2$—; R is selected from $H_2N$—$(CH_2)_m$—, HO—$(CH_2)_m$—, —HN—$CH_2$—$CH_2$—, Q-$(CH_2)_m$—, a moiety having a structure:

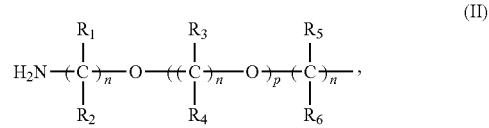

a moiety having a structure:

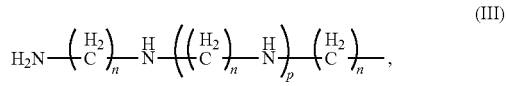

or
a moiety having a structure:

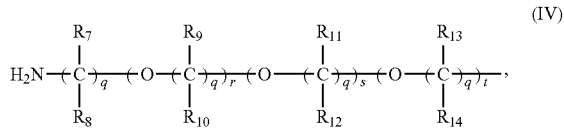

where $R_1$-$R_{14}$ are independently chosen from hydrogen and ($C_1$-$C_3$)alkyl; m is an integer from 2-12, n is an integer from 2-10, p is an integer from 1-10, q is an integer from 2-10 and r, s and t are numbers from 1 to 10; Q is a 5-6 membered heterocyclic ring having one or two nitrogen atoms in the ring or Q is a benzene sulfonamide moiety; and with a proviso that when R' is —CH$_2$—CH$_2$—, R is —HN—CH$_2$—CH$_2$— and the nitrogen of R forms a covalent bond with a carbon atom of R' to form a heterocyclic ring.

An electroplating bath including one or more sources of copper ions, one or more accelerators, one or more suppressors, one or more electrolytes and one or more compounds comprising the reaction products disclosed above.

A method of electroplating includes providing a substrate; immersing the substrate in the electroplating bath disclosed above; applying a current to the substrate and the electroplating bath; and electroplating copper on the substrate.

The reaction products provide copper layers having a substantially level surface across a substrate, even on substrates having small features and on substrates having a variety of feature sizes. The electroplating methods effectively deposit copper on substrates and in blind vias and through-holes such that the copper plating baths have high throwing power. In addition, the copper deposits have reduced nodules.

DETAILED DESCRIPTION OF THE INVENTION

As used throughout this specification the following abbreviations shall have the following meanings unless the context clearly indicates otherwise: A=amperes; A/dm$^2$=amperes per square decimeter; ° C.=degrees Centigrade; g=gram; ppm=parts per million=mg/L; L=liter, μm=micron=micrometer; mm=millimeters; cm=centimeters; DI=deionized; mL=milliliter; mol=moles; mmol=millimoles; Mw=weight average molecular weight; Mn=number average molecular weight;

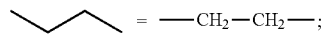 = —CH$_2$—CH$_2$—;

PCB=printed circuit board. All numerical ranges are inclusive and combinable in any order, except where it is clear that such numerical ranges are constrained to add up to 100%.

As used throughout the specification, "feature" refers to the geometries on a substrate. "Aperture" refers to recessed features including through-holes and blind vias. As used throughout this specification, the term "plating" refers to electroplating. "Deposition" and "plating" are used interchangeably throughout this specification. "Leveler" refers to an organic compound or salt thereof that is capable of providing a substantially level or planar metal layer. The terms "leveler" and "leveling agent" are used interchangeably throughout this specification. "Accelerator" refers to an organic additive that increases the plating rate of the electroplating bath. "Suppressor" refers to an organic additive that suppresses the plating rate of a metal during electroplating. The terms "printed circuit boards" and "printed wiring boards" are used interchangeably throughout this specification. The term "moiety" means a part of a molecule or polymer that may include either whole functional groups or parts of functional groups as substructures. The terms "moiety" and "group" are used interchangeably throughout the specification. The articles "a" and "an" refer to the singular and the plural.

Compounds include reaction products of amines and quinones as Michael addition receptors. Amines of the present invention have the following formula:

where R' is selected from hydrogen or a moiety —CH$_2$—CH$_2$—; R is selected from moieties H$_2$N—(CH$_2$)$_m$—, HO—(CH$_2$)$_m$—, —HN—CH$_2$—CH$_2$—, Q-(CH$_2$)$_m$—, a moiety having a structure:

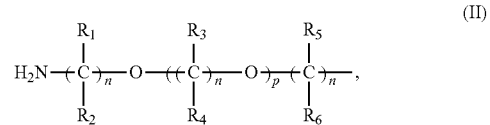

a moiety having a structure:

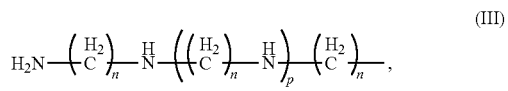

or a moiety having a structure:

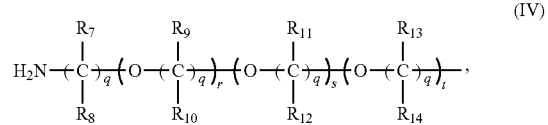

where R$_1$-R$_{14}$ are independently chosen from hydrogen and (C$_1$-C$_3$)alkyl, preferably R$_1$-R$_6$ are independently chosen from hydrogen and methyl, more preferably R$_1$-R$_6$ are chosen from hydrogen; preferably R$_7$-R$_{14}$ are independently chosen from hydrogen and methyl; m is an integer from 2-12, preferably from 2-3, n is an integer from 2-10, preferably 2-5, p is an integer from 1-10, preferably 1-5, more preferably from 1-4, q is an integer from 2-10 and r, s and t are independently numbers from 1 to 10; Q is a 5-6 membered heterocyclic ring having one or two nitrogen atoms in the ring such as an imidazole or pyridine moiety, or Q is a benzene sulfonamide moiety having formula (V) below; and with a proviso that when R' is —CH$_2$—CH$_2$—, R is —HN—CH$_2$—CH$_2$— and the nitrogen of R forms a covalent bond with a carbon of R' to form a heterocyclic ring such as a piperizine ring. Most preferably R' is hydrogen and R is moiety (II).

(V)

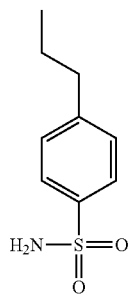

Amines having formula (I) include, but are not limited to ethylene diamine, aminoethan-1-ol, 2,2'-(ethylenedioxy)bis(ethylamine), 3,3'-(butane-1,4-dihylbis(oxy))bis(propan-1-amine), poly(1-(2-((3-(2-aminopropoxy)butan-2-yl)oxy)ethoxy)propan-2-amine) and 4-(2-aminoethyl)benzene sulfonamide.

When n is 2 and p is 5 a preferred compound having moiety (II) is 6,8,11,15,17-pentamethyl-4,7,10,13,16,19-hexaoxadocosane-2,21-diamine which has the following structure:

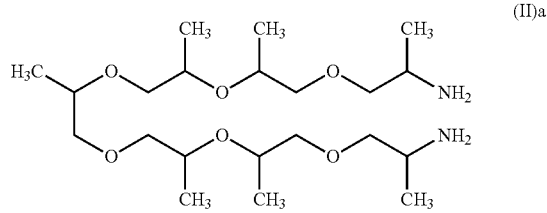 [SMILES: CC(N)COCC(C)OC(C)COCC(C)OCC(C)OC(C)COCC(C)N]

(II)a

A preferred compound having moiety (IV) has the following structure:

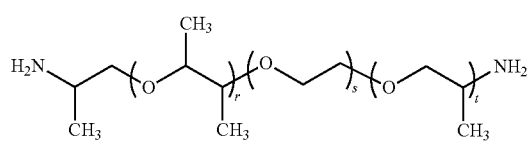

(IV)a where the variables r, s and t are defined above. Preferably the Mw ranges from 200 g/mole to 2000 g/mole.

Preferably quinones include compounds having formula:

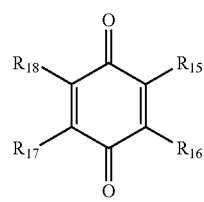

(VI)

where $R_{15}$, $R_{16}$, $R_{17}$ and $R_{18}$ are independently chosen from hydrogen, hydroxyl, linear or branched hydroxy($C_1$-$C_{10}$) alkyl halogen, linear or branched ($C_1$-$C_{10}$)alkyl and linear or branched amino($C_1$-$C_{10}$)alkyl, where carbon atoms of $R_{15}$ and $R_{16}$ may be taken together to form a fused aromatic ring to form a structure having formula:

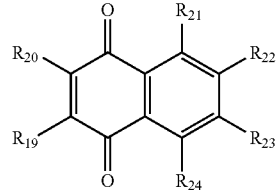

(VII)

where $R_{19}$ and $R_{20}$ are the same as $R_{17}$ and $R_{18}$ described above and $R_{21}$, $R_{22}$, $R_{23}$ and $R_{24}$ are independently chosen from hydrogen, hydroxyl, linear or branched hydroxy($C_1$-$C_{10}$)alkyl halogen, linear or branched ($C_1$-$C_{10}$)alkyl and linear or branched amino($C_1$-$C_{10}$)alkyl. Preferably the quinone is formula (VI) where $R_{15}$, $R_{16}$, $R_{17}$ and $R_{18}$ are independently chosen from hydrogen, hydroxyl and linear or branched ($C_1$-$C_5$) or formula (VII) where $R_{19}$, $R_{20}$, $R_{21}$, $R_{22}$, $R_{23}$ and $R_{24}$ are independently chosen from hydrogen, hydroxyl and linear or branched ($C_1$-$C_5$)alkyl. More preferably the quinone is chosen from formula (VI) where $R_{15}$, $R_{16}$, $R_{17}$ and $R_{18}$ are independently chosen from hydrogen and hydroxyl and formula (VII) where $R_{19}$, $R_{20}$, $R_{21}$, $R_{22}$, $R_{23}$ and $R_{24}$ are independently chosen from hydrogen and hydroxyl. A preferred quinone having formula (VI) is benzoquinone and a preferred quinone having formula (VII) is naphthalene-1,4-dione.

The reaction products of the present invention may be prepared by Michael addition. Conventional Michael addition procedures may be followed to prepare the reaction products of the present invention. Amines function as Michael addition donors and quinones are Michael addition acceptors. In general sufficient amount of quinone is added to a reaction vessel followed by adding sufficient amount of solvent such as ethanol, dichloromethane, ethyl acetate, acetone, water or mixtures thereof. A sufficient amount of amine is then added to the reaction vessel. Typically the molar ratio of the amount of quinone to amine in the reaction vessel is 0.75-1:1; however, this ratio may vary depending on the specific reactants. Minor experimentation may be done to find the preferred reactant molar ratios for particular reactants. The reaction may be done at room temperature to 110° C. or such as from room temperature to 60° C. for 20-24 hours or 4-6 hours.

The plating baths and methods which include one or more of the reaction products are useful in providing a substantially level plated metal layer on a substrate, such as a printed circuit board or semiconductor chip. Also, the plating baths and methods are useful in filling apertures in a substrate with metal. The copper deposits have good throwing power and reduced nodule formation.

Any substrate upon which copper can be electroplated may be used as a substrate with the copper plating baths containing the reaction products. Such substrates include, but are not limited to: printed wiring boards, integrated circuits, semiconductor packages, lead frames and interconnects. An integrated circuit substrate may be a wafer used in a dual damascene manufacturing process. Such substrates typically contain a number of features, particularly apertures, having a variety of sizes. Through-holes in a PCB may have a variety of diameters, such as from 50 μm to 350 μm in diameter. Such through-holes may vary in depth, such as from 0.8 mm to 10 mm. PCBs may contain blind vias having a wide variety of sizes, such as up to 200 μm diameter and 150 μm depth, or greater.

The copper plating baths contain a source of copper ions, an electrolyte, and a leveling agent, where the leveling agent is a reaction product of one or more amines and one or more acrylamides as described above. The copper plating baths may contain a source of halide ions, an accelerator and a suppressor. Optionally, in addition to copper, the electroplating baths may include one or more sources of tin for electroplating a copper/tin alloy. Preferably the electroplating baths are copper electroplating baths.

Suitable copper ion sources are copper salts and include without limitation: copper sulfate; copper halides such as copper chloride; copper acetate; copper nitrate; copper tetrafluoroborate; copper alkylsulfonates; copper aryl sulfonates; copper sulfamate; copper perchlorate and copper gluconate. Exemplary copper alkane sulfonates include copper ($C_1$-$C_6$)alkane sulfonate and more preferably copper ($C_1$-$C_3$)alkane sulfonate. Preferred copper alkane sulfonates are copper methanesulfonate, copper ethanesulfonate and copper propanesulfonate. Exemplary copper arylsulfonates include, without limitation, copper benzenesulfonate and copper p-toluenesulfonate. Mixtures of copper ion sources may be used. One or more salts of metal ions other than copper ions may be added to the present electroplating baths. Typically, the copper salt is present in an amount sufficient to provide an amount of copper metal of 10 to 400 g/L of plating solution.

Suitable tin compounds include, but are not limited to salts, such as tin halides, tin sulfates, tin alkane sulfonate such as tin methane sulfonate, tin aryl sulfonate such as tin benzenesulfonate and tin p-toluenesulfonate. The amount of tin compound in these electrolyte compositions is typically an amount that provides a tin content in the range of 5 to 150 g/L. Mixtures of tin compounds may be used in an amount as described above.

The electrolyte useful in the present invention is acidic. Preferably, the pH of the electrolyte is ≤2. Suitable acidic electrolytes include, but are not limited to, sulfuric acid, acetic acid, fluoroboric acid, alkanesulfonic acids such as methanesulfonic acid, ethanesulfonic acid, propanesulfonic acid and trifluoromethane sulfonic acid, aryl sulfonic acids such as benzenesulfonic acid, p-toluenesulfonic acid, sulfamic acid, hydrochloric acid, hydrobromic acid, perchloric acid, nitric acid, chromic acid and phosphoric acid. Mixtures of acids may be advantageously used in the present metal plating baths. Preferred acids include sulfuric acid, methanesulfonic acid, ethanesulfonic acid, propanesulfonic acid, hydrochloric acid and mixtures thereof. The acids may be present in an amount in the range of 1 to 400 g/L. Electrolytes are generally commercially available from a variety of sources and may be used without further purification.

Such electrolytes may optionally contain a source of halide ions. Typically chloride ions are used. Exemplary chloride ion sources include copper chloride, tin chloride, sodium chloride, potassium chloride and hydrochloric acid. A wide range of halide ion concentrations may be used in the present invention. Typically, the halide ion concentration is in the range of 0 to 100 ppm based on the plating bath. Such halide ion sources are generally commercially available and may be used without further purification.

The plating compositions typically contain an accelerator. Any accelerators (also referred to as brightening agents) are suitable for use in the present invention. Such accelerators are well-known to those skilled in the art. Accelerators include, but are not limited to, N,N-dimethyl-dithiocarbamic acid-(3-sulfopropyl)ester; 3-mercapto-propylsulfonic acid-(3-sulfopropyl)ester; 3-mercapto-propylsulfonic acid sodium salt; carbonic acid, dithio-O-ethylester-S-ester with 3-mercapto-1-propane sulfonic acid potassium salt; bis-sulfopropyl disulfide; bis-(sodium sulfopropyl)-disulfide; 3-(benzothiazolyl-S-thio)propyl sulfonic acid sodium salt; pyridinium propyl sulfobetaine; 1-sodium-3-mercaptopropane-1-sulfonate; N,N-dimethyl-dithiocarbamic acid-(3-sulfoethyl)ester; 3-mercapto-ethyl propylsulfonic acid-(3-sulfoethyl)ester; 3-mercapto-ethylsulfonic acid sodium salt; carbonic acid-dithio-O-ethylester-S-ester with 3-mercapto-1-ethane sulfonic acid potassium salt; bis-sulfoethyl disulfide; 3-(benzothiazolyl-S-thio)ethyl sulfonic acid sodium salt; pyridinium ethyl sulfobetaine; and 1-sodium-3-mercaptoethane-1-sulfonate. Accelerators may be used in a variety of amounts. In general, accelerators are used in an amount in a range of 0.1 ppm to 1000 ppm.

Any compound capable of suppressing the metal plating rate may be used as a suppressor in the present electroplating compositions. Suitable suppressors include, but are not limited to, polypropylene glycol copolymers and polyethylene glycol copolymers, including ethylene oxide-propylene oxide ("EO/PO") copolymers and butyl alcohol-ethylene oxide-propylene oxide copolymers. Suitable butyl alcohol-ethylene oxide-propylene oxide copolymers are those having a weight average molecular weight of 100 to 100,000 g/mole, preferably 500 to 10,000 g/mole. When such suppressors are used, they are typically present in an amount in the range of 1 to 10,000 ppm based on the weight of the composition, and more typically from 5 to 10,000 ppm. The leveling agents of the present invention may also possess functionality capable of acting as suppressors.

In general, the reaction products have a number average molecular weight (Mn) of 200 to 100,000 g/mole, typically from 300 to 50,000 g/mole, preferably from 500 to 30,000 g/mole, although reaction products having other Mn values may be used. Such reaction products may have a weight average molecular weight (Mw) value in the range of 1000 to 50,000 g/mole, typically from 5000 to 30,000 g/mole, although other Mw values may be used.

The amount of the reaction product, i.e., leveling agent, used in the electroplating baths depends upon the particular leveling agents selected, the concentration of the metal ions in the electroplating bath, the particular electrolyte used, the concentration of the electrolyte and the current density applied. In general, the total amount of the leveling agent in the electroplating baths ranges from 0.01 ppm to 1000 ppm, preferably from 0.1 ppm to 100 ppm, most preferably from 0.5 ppm to 50 ppm, based on the total weight of the plating bath, although greater or lesser amounts may be used.

The electroplating baths may be prepared by combining the components in any order. It is preferred that the inorganic components such as source of metal ions, water, electrolyte and optional halide ion source are first added to the bath vessel, followed by the organic components such as leveling agent, accelerator, suppressor, and any other organic component.

The electroplating baths may optionally contain at least one additional leveling agent. Such additional leveling agents may be another leveling agent of the present invention, or alternatively, may be any conventional leveling agent. Suitable conventional leveling agents that can be used in combination with the present leveling agents include, without limitations, those disclosed in U.S. Pat. No. 6,610,192 to Step et al., U.S. Pat. No. 7,128,822 to Wang et al., U.S. Pat. No. 7,374,652 to Hayashi et al. and U.S. Pat. No. 6,800,188 to Hagiwara et al. Such combination of leveling agents may be used to tailor the characteristics of the plating bath, including leveling ability and throwing power.

Typically, the plating baths may be used at any temperature from 10 to 65° C. or higher. Preferably, the temperature of the plating bath is from 10 to 35° C. and more preferably from 15 to 30° C.

In general, the electroplating baths are agitated during use. Any suitable agitation method may be used and such methods are well-known in the art. Suitable agitation methods include, but are not limited to: air sparging, work piece agitation, and impingement.

Typically, a substrate is electroplated by contacting the substrate with the plating bath. The substrate typically functions as the cathode. The plating bath contains an anode, which may be soluble or insoluble. Potential is typically applied to the electrodes. Sufficient current density is applied and plating performed for a period of time sufficient to deposit a metal layer having a desired thickness on the substrate as well as to fill blind vias, trenches and through-holes, or to conformally plate through-holes. Current densities may range from 0.05 to 10 A/dm$^2$, although higher and lower current densities may be used. The specific current density depends in part upon the substrate to be plated, the composition of the plating bath, and the desired surface metal thickness. Such current density choice is within the abilities of those skilled in the art.

An advantage of the present invention is that substantially level metal deposits are obtained on a PCB. Through-holes, blind vias or combinations thereof in the PCB are substantially filled or through-holes are conformally plated with desirable throwing power. A further advantage of the present invention is that a wide range of apertures and aperture sizes may be filled or conformally plated with desirable throwing power.

Throwing power is defined as the ratio of the average thickness of the metal plated in the center of a through-hole compared to the average thickness of the metal plated at the surface of the PCB sample and is reported as a percentage. The higher the throwing power, the better the plating bath is able to conformally plate the through-hole. Metal plating compositions of the present invention have a throwing power of ≥45%, preferably ≥50%.

The reaction products provide copper and copper/tin layers having a substantially level surface across a substrate, even on substrates having small features and on substrates having a variety of feature sizes. The plating methods effectively deposit metals in through-holes such that the electroplating baths have good throwing power.

While the methods of the present invention have been generally described with reference to printed circuit board manufacture, it is appreciated that the present invention may be useful in any electrolytic process where an essentially level or planar copper or copper/tin deposit and filled or conformally plated apertures are desired. Such processes include semiconductor packaging and interconnect manufacture.

The following examples are intended to further illustrate the invention but are not intended to limit its scope.

Example 1

22.5 mmol benzoquinone is added into a 100 mL three necked flask followed by 30 mL mixture of ethanol and water. Then 30 mmol 2,2'-(ethylenedioxy)bis(ethylamine) is added into the reaction mixture. The reaction is done at room temperature overnight. After the reaction is complete, all the solvent is removed under reduced pressure a solid material. Reaction product 1 is used without purification.

Example 2

22.5 mmol benzoquinone is added into a 100 mL three necked flask followed by 30 mL mixture of ethanol and water. Then 30 mmol 6,8,11,15,17-pentamethyl-4,7,10,13,16,19-hexaoxadocosane-2,21-diamine is added into the reaction mixture. The reaction is done at room temperature. The reaction mixture is kept overnight at room temperature. All the solvent is removed under reduced pressure leaving a solid material. Reaction product 2 is used without purification.

Example 3

22.5 mmol naphthalene-1,4-dione is added into a 100 mL three necked flask followed by 30 mL mixture of ethanol and water. Then 30 mmol 6,8,11,15,17-pentamethyl-4,7,10,13,16,19-hexaoxadocosane-2,21-diamine is added into the reaction mixture. The reaction is done at 110° C. over 4-5 hours. All the solvent is removed under reduced pressure leaving a solid material. Reaction product 3 is used without purification.

Example 4

A plurality of copper electroplating baths are prepared by combining 75 g/L copper as copper sulfate pentahydrate, 240 g/L sulfuric acid, 60 ppm chloride ion, 1 ppm of an accelerator and 1.5 g/L of a suppressor. The accelerator is bis(sodium-sulfopropyl)disulfide. The suppressor is an EO/PO copolymer having a weight average molecular weight of <5,000 and terminal hydroxyl groups. Each electroplating bath also contains one of reaction products 1-3 in amounts from 2 ppm to 20 ppm as shown in the table in Example 5 below. The reaction products are used without purification.

Example 5

Samples of 3.2 mm thick, double-sided FR4 PCBs, 5 cm×9.5 cm, having a plurality of through-holes are electroplated with copper in Haring cells using the copper electroplating baths of Example 4. The samples have 0.25 mm diameter through-holes. The temperature of each bath is 25° C. A current density of 3 A/dm$^2$ is applied to the samples for 40 minutes. The copper plated samples are analyzed to determine the throwing power ("TP") of the plating baths, and the number of nodules on the copper deposits.

Throwing power is calculated by determining the ratio of the average thickness of the copper plated in the center of a through-hole compared to the average thickness of the copper plated at the surface of the PCB sample. The throwing power is reported in the table as a percentage.

| Reaction Product | Leveler (ppm) | % TP | Nodules |
|---|---|---|---|
| 1 | 2 | 60 | 0 |
|  | 5 | 57 | 0 |
|  | 10 | 50 | 0 |
| 2 | 5 | 57 | 0 |
|  | 10 | 53 | 0 |
|  | 20 | 54 | 1 |
| 3 | 2 | 71 | 0 |
|  | 5 | 63 | 0 |
|  | 10 | 54 | 0 |

The results show that the throwing power exceeds 45% indicating good throwing power performance for the reaction products. In addition, all of the samples show significant nodule reduction on the copper deposits.

What is claimed is:

1. An electroplating bath comprising one or more sources of copper ions, one or more accelerators, one or more suppressors, one or more electrolytes and one or more compounds comprising a reaction product of an amine and a quinone wherein the amine has a formula:

(I)

where R' is hydrogen; and R comprises $H_2N(CH_2)_m-$, $HO-(CH_2)_m-$, $Q-(CH_2)_m-$, a moiety having a structure:

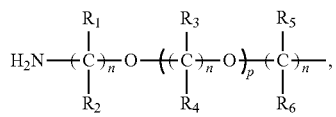
(II)

a moiety having a structure:

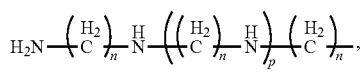
(III)

or a moiety having a structure:

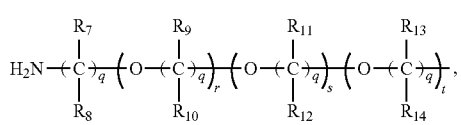
(IV)

where $R_1$-$R_{14}$ are independently chosen from hydrogen and $(C_1$-$C_3)$alkyl; m is an integer from 2-12, n is an integer from 2-10, p is an integer from 1-10, q is an integer from 2-10 and r, s and t are numbers from 1 to 10; and Q is a 5-6 membered heterocyclic ring having one or two nitrogen atoms in the ring or Q is a benzene sulfonamide moiety.

2. The electroplating bath of claim 1, wherein the amine has the formula:

(I)

wherein R' is hydrogen and R is the moiety:

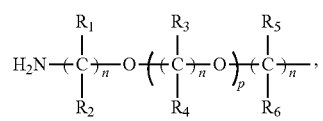
(II)

wherein $R_1$-$R_6$ are hydrogen, n is an integer from 2-5 and p is an integer from 1-5.

3. The electroplating bath of claim 1, wherein the amine has a formula:

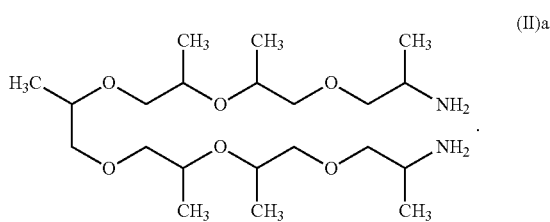 [SMILES: CC(N)COCC(C)OC(C)COCC(C)OCC(C)OC(C)COCC(C)N]
(II)a

4. The electroplating bath of claim 1, wherein the quinone has a formula:

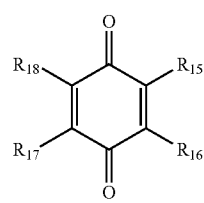
(VI)

where $R_{15}$, $R_{16}$, $R_{17}$ and $R_{18}$ are independently chosen from hydrogen, hydroxyl, linear or branched hydroxy $(C_1$-$C_{10})$alkyl halogen, linear or branched $(C_1$-$C_{10})$ alkyl and linear or branched amino$(C_1$-$C_{10})$alkyl.

5. The electroplating bath of claim 1, wherein the quinone has a formula:

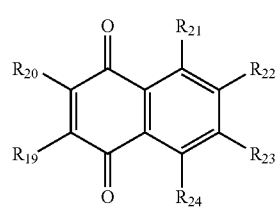
(VII)

where $R_{19}$ and $R_{20}$ are independently chosen from hydrogen, hydroxyl, linear or branched hydroxy$(C_1$-$C_{10})$ alkyl halogen, linear or branched $(C_1$-$C_{10})$alkyl and linear or branched amino$(C_1$-$C_{10})$alkyl, and $R_{21}$, $R_{22}$, $R_{23}$ and $R_{24}$ are independently chosen from hydrogen, hydroxyl, linear or branched hydroxy$(C_1$-$C_{10})$alkyl halogen, linear or branched $(C_1$-$C_{10})$alkyl and linear or branched amino$(C_1$-$C_{10})$alkyl.

6. The electroplating bath of claim 1, further comprising one or more sources of tin ions.

7. A method of electroplating comprising:
a) providing a substrate;
b) immersing the substrate in the electroplating bath of claim 1;
c) applying a current to the substrate and the electroplating bath; and
d) electroplating copper on the substrate.

8. The method of claim 7, wherein the electroplating bath of claim 1 further comprises one or more sources of tin ions.

9. The method of claim 7, wherein the substrate comprises a plurality of one or more of through-holes and blind vias.

* * * * *